US011740195B2

(12) United States Patent
Lutz

(10) Patent No.: US 11,740,195 B2
(45) Date of Patent: Aug. 29, 2023

(54) DEVICE FOR CONTROLLING THE TEMPERATURE OF A TEST SAMPLE

(71) Applicant: GRABNER INSTRUMENTS MESSTECHNIK GMBH, Vienna (AT)

(72) Inventor: Josef Lutz, Rohrau (AT)

(73) Assignee: GRABNER INSTRUMENTS MESSTECHNIK GMBH, Vienna (AT)

( * ) Notice: Subject to any disclaimer, the term of this patent is extended or adjusted under 35 U.S.C. 154(b) by 1290 days.

(21) Appl. No.: 16/075,861

(22) PCT Filed: Feb. 7, 2017

(86) PCT No.: PCT/AT2017/000006
§ 371 (c)(1),
(2) Date: Aug. 6, 2018

(87) PCT Pub. No.: WO2017/136861
PCT Pub. Date: Aug. 17, 2017

(65) Prior Publication Data
US 2019/0041344 A1    Feb. 7, 2019

(30) Foreign Application Priority Data
Feb. 9, 2016    (AT) .................................. A 61/2016

(51) Int. Cl.
*G01N 25/52* (2006.01)
*H01L 23/38* (2006.01)
(Continued)

(52) U.S. Cl.
CPC ............. *G01N 25/52* (2013.01); *F25B 21/02* (2013.01); *G01N 25/50* (2013.01); *H01L 23/38* (2013.01);
(Continued)

(58) Field of Classification Search
CPC ........ G01N 25/52; G01N 25/50; G01N 25/40; H01L 23/38; H01L 35/00; F25B 21/02;
(Continued)

(56) References Cited

U.S. PATENT DOCUMENTS 2,974,519 A * 3/1961 Rhodes ..................... B01L 7/00
73/36
2005/0006372 A1    1/2005 Murakami et al.
(Continued)

FOREIGN PATENT DOCUMENTS

EP          0540886 A2    5/1993
JP       2010-203823 A    9/2010
(Continued)

OTHER PUBLICATIONS

International Search Report dated Apr. 25, 2017 issued in corresponding PCT/AT2017/00006 w/English language Abstract.

*Primary Examiner* — Brandi N Hopkins
*Assistant Examiner* — Janice M Soto
(74) *Attorney, Agent, or Firm* — Pillsbury Winthrop Shaw Pittman, LLP

(57) ABSTRACT

In a device for controlling the temperature of a test sample in a measuring device for measuring material properties of the test sample, comprising a measuring cell for receiving the test sample, at least one temperature controlling element, and a thermal storage element coupled to the temperature controlling element to transfer heat, wherein means are provided for changing the thermal resistance between the thermal storage element and the measuring cell in order to selectively couple or decouple the thermal storage element and the measuring cell in terms of heat transfer, the ratio of the thermal capacity of the thermal storage element to the thermal capacity of the measuring cell is greater than 1:1, preferably at least 2:1, preferably at least 5:1.

11 Claims, 1 Drawing Sheet

(51) Int. Cl.
*F25B 21/02* (2006.01)
*G01N 25/50* (2006.01)
*F28D 20/02* (2006.01)
*F28F 13/00* (2006.01)

(52) U.S. Cl.
CPC ...... *F25B 2321/0251* (2013.01); *F28D 20/02* (2013.01); *F28F 2013/008* (2013.01)

(58) Field of Classification Search
CPC .......... F25B 2321/0251; F25B 2400/05; F28D 20/02; F28D 15/00; F28F 2013/008; F28F 13/00; B01L 7/00; G05D 23/01
See application file for complete search history.

(56) References Cited

U.S. PATENT DOCUMENTS

| | | |
|---|---|---|
| 2010/0227383 A1 | 9/2010 | Amano et al. |
| 2013/0128915 A1* | 5/2013 | Aschauer ................ F28F 13/00 374/8 |
| 2013/0136150 A1* | 5/2013 | Haas ...................... G01N 25/50 374/8 |
| 2015/0233614 A1 | 8/2015 | Kindt et al. |

FOREIGN PATENT DOCUMENTS

| | | | |
|---|---|---|---|
| JP | 2011-067149 A | 4/2011 | |
| WO | 2012/017009 A1 | 2/2012 | |
| WO | WO-2012161566 A1 * | 11/2012 | .............. B01L 3/505 |

* cited by examiner

DEVICE FOR CONTROLLING THE TEMPERATURE OF A TEST SAMPLE

CROSS-REFERENCE TO RELATED APPLICATIONS

This application is the U.S. National Stage of PCT/AT2017/000006, filed Feb. 7, 2017, which in turn claims priority to Austrian Application Ser. No. A 61/2016, filed Feb. 9, 2016, all contents of which are hereby incorporated by reference in their entireties.

BACKGROUND OF THE INVENTION

Field of the Invention

The invention relates to a device for controlling the temperature of a test sample in a measuring device for measuring material properties of the test sample, comprising a measuring cell for receiving the test sample, at least one temperature controlling element, and a thermal storage element coupled to the temperature controlling element to transfer heat, wherein means are provided for changing the thermal resistance between the thermal storage element and the measuring cell in order to selectively couple or decouple the thermal storage element and the measuring cell in terms of heat transfer.

The invention further relates to a method for measuring material properties of a test sample and subsequently cooling the test sample using a device according to the invention.

Description of Related Art

In many cases relating to the quality assessment of materials, to the definition of material constants or to certifications, appropriate measurements have to be carried out at predefined temperatures of the test samples, or the temperature of a sample has to be varied during a measuring process. Where the required measurements have to be carried out at temperatures clearly above or below room temperature, the respective measuring devices usually are equipped with cooling and/or heating units. The test sample is thus inserted into the measuring device at room temperature, brought to the required temperature in the measuring device, the measurement is performed, and the sample is subsequently again cooled to room temperature, or brought to the room temperature range, in order to enable its safe removal from the measuring device. Although the temperature control steps in many cases are of little relevance to the measuring process, they are essential for the throughput of samples (measurements per hour), because they may take quite some time at temperatures far below or far above room temperature.

In conventional designs of cooling units for test samples, or for measuring cells provided for receiving test samples, Peltier elements are used as temperature controlling or cooling elements, in particular in the event of portable measuring devices. Efficient cooling will be achieved if the at least one Peltier element contacts the sample or the measuring cell directly so as to ensure a low thermal resistance.

For heating the measuring cell, it is possible to use either additional heating cartridges in the measuring cell or the Peltier element itself, by reversing the polarity of the applied voltage supply.

The limitation of the use of Peltier elements as heating and cooling elements, above all, resides in the maximum temperature permissible for such elements of usually 120° C. (in few cases up to 200° C.). Peltier elements will be destroyed when exceeding this limit temperature or their durability will at least be strongly reduced unless the maximum temperature is excessively exceeded. For applications at cell temperatures of above 200° C., another cooling technology has, therefore, frequently to be applied, or the Peltier element is thermally separated from the measuring cell to such an extent that the maximum temperature on the Peltier element will not be exceeded.

In the prior art, various options have been described to prevent exceeding of the limit temperature. One of these options is disclosed in EP 540886 B1 and resides in the use of a "thermal diode". A liquid layer is interposed between the Peltier element and the measuring cell. If the evaporation temperature of the liquid lies below the critical temperature of the Peltier element, the latter cannot be overheated because of the vapour between the hot measuring cell and the Peltier element being a poor heat conductor.

Another option (WO 2012/017009 A1) consists in mechanically separating the cooling unit (Peltier element plus associated cooling body) from the measuring cell before the Peltier element exceeds the limit temperature during the cooling process. The cooling process can be accelerated by interrupted cooling in that the cooling unit is first cooled and then brought into mechanical contact with the measuring cell. If the temperature of the Peltier element exceeds a maximum value because of the heat flow coming from the measuring cell, the mechanical contact will be interrupted again and the cooler side of the cooling unit will be cooled again. This process is cyclically repeated until the maximum temperature of the Peltier element is no longer reached and the cooling unit can remain in constant contact with the sample or measuring cell for the purpose of further cooling.

The essential disadvantage of a permanent contact between the cooling unit and the sample or measuring cell consists in the temperature limitation and a high peak performance for cooling during the cooling phase.

The described prior art solutions involve the following drawbacks. In the case of the "thermal diode", the cooling of the sample or measuring cell is, in particular, very slow, especially at high temperatures, since the "thermal diode" transports only little thermal power into the Peltier element. For a more rapid cooling process, an additional cooling technique for high temperatures would have to be provided, which would in most cases be neither reasonable nor useful for space and cost reasons.

In the system with "interrupted cooling", it is primarily the mechanical complexity required for moving the cooling unit which constitutes a big disadvantage in terms of costs and the volume necessary for the mechanics and drive. Moreover, the quality of the surfaces and their alterations over the lifetime constitute a critical factor for the cooling efficiency. As in the system of the "thermal diode" and in the system of permanent contact, a high peak performance is additionally required during the cooling process, which makes the entire cooling unit very large.

SUMMARY

The present invention, therefore, aims to overcome the above-identified drawbacks and to provide a device for controlling the temperature of a test sample, which enables to prevent overheating of a Peltier element and to increase the speed of temperature controlling, in particular cooling.

To solve this object, the invention in a device of the initially defined kind, essentially consists in that the ratio of the thermal capacity of the thermal storage element to the thermal capacity of the measuring cell is greater than 1:1, preferably at least 2:1, preferably at least 5:1.

The temperature control of the measuring cell plus test sample is thus performed by using a thermal storage element having a relatively high thermal capacity. The heat transfer in the case of heating of the measuring cell occurs from the temperature controlling element to the thermal storage element and from the thermal storage element to the measuring cell. In the case of cooling of the measuring cell, the heat transfer takes place from the thermal storage element to the temperature controlling element and from the measuring cell to the thermal storage element. To this end, the thermal storage element is preheated or precooled by the temperature controlling element, heating or cooling of the measuring cell being achieved by the heat-transferring coupling of the thermal storage element to the measuring cell and the thus caused temperature equalization between the same.

The thermal storage element according to the invention is preferably used for cooling the measuring cell. If the measuring cell has to be initially heated for carrying out the necessary measurements and cooled again after having completed the measurements, not only the cooling process but also heating can be effected via heat storage. However, this involves the disadvantage of having to rapidly provide very high temperature changes to the thermal storage element, which may lead to problems, above all in cooling, if one and the same thermal storage element is used both for the heating process and for the cooling process. Therefore, a configuration comprising two different thermal storage elements is preferred, one being appropriately preheated for the heating process and the other being appropriately cooled for the cooling process. The measuring cell can be selectively coupled to one or the other of the thermal storage elements to transfer heat.

Alternatively, the heating of the measuring cell can be performed in a conventional manner via heating elements provided directly in the measuring cell.

The thermal capacity of the thermal storage element may preferably be selected such that the temperature control of the measuring cell will be achieved in a single step, i.e., as opposed to the configuration according to WO 2012/017009 A1, without interrupting the temperature controlling process. When used for cooling the measuring cell, it is, moreover, possible to design the system by suitably selecting a high thermal capacity of the thermal storage element such that the maximum temperature of the thermal storage after completion of the cooling process, i.e. after the heat transfer from the measuring cell to the thermal storage, in particular when reaching full temperature equalization between the measuring cell and the thermal storage element, lies below the critical temperature of the Peltier element. Such a design will, in particular, be feasible if the ratio of the thermal capacity of the thermal storage element to the thermal capacity of the measuring cell is at least 2:1, preferably at least 5:1.

In order to enable precooling or preheating of the thermal storage element, a preferably complete separation of the measuring cell from the temperature control device comprising the temperature controlling element and the thermal storage element is provided. The heat-transferring coupling of the measuring cell to the thermal storage element, and hence the temperature controlling process proper of the measuring cell, preferably occurs after precooling or preheating. The selective heat-transferring coupling and decoupling between the measuring cell and the thermal storage element in this case is ensured by changing the thermal resistance between the measuring cell and the thermal storage element.

The advantage of separating the measuring cell from the temperature control device comprising the temperature controlling element and the thermal storage element, and the advantage of providing a high storage capacity of the thermal storage element, reside in that the speed of the cooling process is no longer a function of the maximum output of the cooling technology (e.g. Peltier elements). The speed until the equalization of the temperatures of the measuring cell and the thermal storage element is almost exclusively determined by the maximum heat transfer between the measuring cell and the thermal storage element.

In the ideal case (no losses and non-linear effects), the equalization temperature $T_{eq}$ between the measuring cell and the thermal storage element results from:

$$T_{eq}=(C_{MZ}*T_{MZ}+C_{WS}*T_{WS})(C_{MZ}+C_{MS})$$

wherein $C_{MZ}$, $C_{WS}$ represent the heat capacities of the measuring cell and the thermal storage element, and $T_{MZ}$ and $T_{WS}$ represent the temperatures of the measuring cell and the thermal storage element before the heat transfer.

Ideally, the temperature $T_{WS}$ of the thermal storage element before the beginning of the heat transfer is so low that the equalization temperature $T_{eq}$ lies below the temperature required for the process steps to follow. Thus, further cooling of the overall system by means of the temperature controlling elements, in particular the Peltier elements, is no longer necessary, and the entire cooling process can be completed within the shortest time possible.

In parallel with the subsequent process steps including the next measurement, the thermal storage element can be brought to the starting temperature for the subsequent cooling process by the temperature controlling element, in particular the Peltier element, in the state decoupled from the sample or measuring cell in terms of heat transfer. Since the time between the cooling processes in the majority of measurement applications is clearly longer than the time for the cooling process proper, the necessary cooling performance is clearly lower. The ratio of the continuous cooling performance of the thermal storage $P_{WS}$ to the cooling performance required during the cooling process for the measuring cell $P_{MZ}$ results from the ratio of the required cooling time $t_K$ to the total time of a measuring cycle $t_M$.

$$E_W=P_{WS}*t_M=P_{MZ}*t_K$$

$E_W$ corresponds to the transferred heat energy.

The device according to the invention can be used to carry out a method that is the subject matter of a second aspect of the present invention. The method according to the invention for measuring material properties of a test sample and subsequently cooling the test sample comprises the steps of
a) measuring the material properties of the test sample at a measuring temperature;
b) before and/or during step a): cooling the thermal storage element in the state decoupled from the measuring cell in terms of heat transfer, by using the temperature controlling element;
c) after steps a) and b): reducing the thermal resistance between the thermal storage element and the measuring cell in order to couple the thermal storage element to the measuring cell to transfer heat;
d) continuously transferring heat from the measuring cell to the thermal storage element, whereby the test sample is cooled from the measuring temperature to a temperature suitable for removing the test sample; and e) removing the test sample.

The ratio of the thermal capacity of the thermal storage element to the thermal capacity of the measuring cell, optionally plus test sample, is, in particular, selected such that the temperature of the thermal storage element at the end of step d) does not exceed 200° C., preferably 160° C., particularly preferably 120° C.

Basically, the heat transfer between the thermal storage element and the measuring cell may occur in any manner whatsoever, e.g. by forced or natural convection, heat radiation or heat conduction, or by a combination thereof. Natural convection is, however, out of the question in most cases because of the comparatively poor energy transfer. The heat transfer by thermal radiation is very efficient at high temperatures ($P \cdot \alpha \cdot T^4$), whereas at low temperatures, such as in cooling processes below 100° C., the efficiency is rather low.

The heat transfer between the measuring cell and the thermal storage element preferably takes place via an interposed heat transfer element, by which the thermal resistance between the measuring cell and the thermal storage element can be adjusted and/or changed.

According to a preferred configuration, the means for changing the thermal resistance comprise a drive for moving the thermal storage element, the measuring cell and/or an interposed heat transfer element between a first position, in which the thermal storage element and the measuring cell are in thermoconductive contact, and a second position, in which the thermal storage element and the measuring cell are thermoconductively separated from each other. In this case, heat transfer primarily occurs by thermal conduction.

According to an alternative configuration, a fluid cycle, in particular a liquid cycle, connecting the thermal storage element and the measuring cell is provided as heat transfer element, wherein the means for changing the thermal resistance comprise a pump disposed in the fluid cycle. Heat transport by means of a liquid in a pipe system in this case functions similarly as in a heating system and comprises a combination of forced convection and heat conduction.

A further preferred configuration provides that the temperature control device comprises a thermoelectric element, in particular a Peltier element, or is designed as such an element.

A preferred application of the invention consists in a device or method for measuring the flash point of a test sample. The configuration in this respect is preferably devised such that the device is designed for measuring the flash point of a fluid or solid test sample, in particular a petroleum product, wherein the measuring cell comprises a measuring chamber for receiving the test sample, which is preferably comprised of a measuring tub and a lid and which is provided with an electric igniter including a spark gap, at least one temperature sensor, and a pressure measuring device, wherein a control device for controlling the temperature control device, the igniter and the contacting device and for detecting the measurements of the temperature sensor and the pressure measuring device is further provided.

The flash point of a material or substance is used for transport and safety regulations to define inflammable and explosive materials and provides information on the presence of volatile and inflammable components in a non-volatile and non-combustible material or substance.

According to ASTM, the flash point is defined as the lowest temperature, corrected to the barometric air pressure of 101.3 kPa, at which the vapour of a sample inflames when a test flame is applied, causing a flame to emerge, which itself travels over the surface of the sample and covers at least two thirds of said surface.

For measuring the flash point, a test sample is inserted into the measuring cell, and the measuring cell plus test sample are heated to a predetermined temperature, which is in any case below the expected flash point temperature. After this, the temperature of the measuring cell plus test sample is slowly increased further, and ignitions are performed at constant temperature intervals. Immediately after an ignition, the pressure build-up in the measuring cell is measured by a pressure measuring device, which is preferably designed as a piezoresistive pressure transducer. The flash point temperature is indicated by a further temperature sensor.

In the context of the invention, the thermal capacity of a body is meant to denote the ratio of the heat supplied to it to the temperature increase caused thereby: $C=dQ/dT$. The unit of the thermal capacity is J/K. The thermal storage element according to the invention is thus any body that is able to increase its temperature with heat input, or reduce its temperature by heat removal. For homogenous bodies, the thermal capacity can be calculated as the product of the mass and the mass-related specific, material-dependent thermal capacity c of the substance concerned. Thermal storage elements having high specific thermal capacities of preferably >0.25, particularly preferred >0.45 $kJ \cdot kg^{-1} \cdot K^{-1}$, are particularly suitable in the context of the invention. The thermal storage elements in such cases are preferably made of a metal such as copper, brass, steel, aluminum.

BRIEF DESCRIPTION OF THE DRAWINGS

In the following, the invention will be explained in more detail by way of an exemplary embodiment schematically illustrated in the drawing.

Therein.

DETAILED DESCRIPTION

Figure 1:
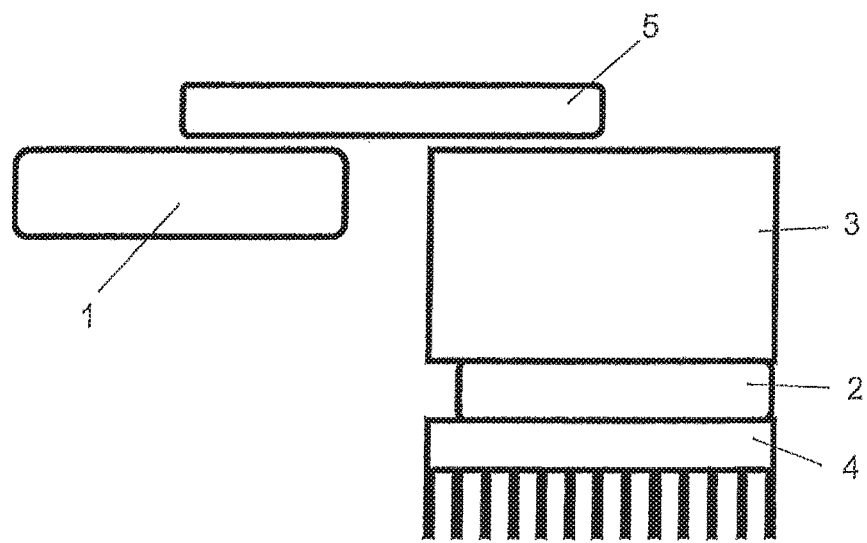
FIG. 1 is a general illustration of the invention.

FIG. 1 depicts a measuring cell denoted by 1, which, in the application case, contains, for instance, a test sample, e.g. of a liquid, whose substance properties, e.g. flash point, are to be determined. To determine the flash point, the test sample is heated to a given temperature, whereupon the necessary measurements are performed. After this, the test sample is to be cooled to such an extent that the test sample can be removed from the measuring device. For cooling the measuring cell or test sample, the device comprises a temperature controlling element 2, which in the present exemplary embodiment is designed as a Peltier element. In operation, the Peltier element 2 draws heat from the thermal storage element 3 and dissipates it via the cooling body 4. The thermal storage element 3 is in direct heat-conducting contact with the Peltier element 2. In order to accelerate the cooling process for cooling the test sample, the thermal storage element 3 is already precooled during the above-described measuring process or even before. During precooling, the measuring cell 1 and the thermal storage element 3 are decoupled from each other such that substantially no heat transfer takes place between the same. As soon as the necessary measurements have been completed, the measuring cell 1 and the thermal storage element 3 are coupled to each other such that a heat transfer occurs and the measuring cell 1 is cooled. To this end, means for changing the thermal resistance between the thermal storage element 3 and the measuring cell 1 are provided in order to selectively couple or decouple the thermal storage element 3 and the measuring cell 1 in terms of heat transfer. The means for changing the thermal resistance in this exemplary embodiment are designed as a heat transfer element 5 with adjustable heat transfer properties.

The heat transport between the measuring cell 1 and the thermal storage element 3 can be accomplished by heat conduction via solid bodies. In this case, a mechanical contact must be established between the measuring cell 1 and the thermal storage element 3. This may be effected either by moving a plate or wedges, or by rotating an ellipse. In any case, a mechanical part with good thermal conductivity (e.g. metal) has to be moved and brought into contact with both elements. Another option is to directly bring into contact the measuring cell 1 and the thermal storage element 3 by an appropriate movement of one or both of these components.

Figure 2:
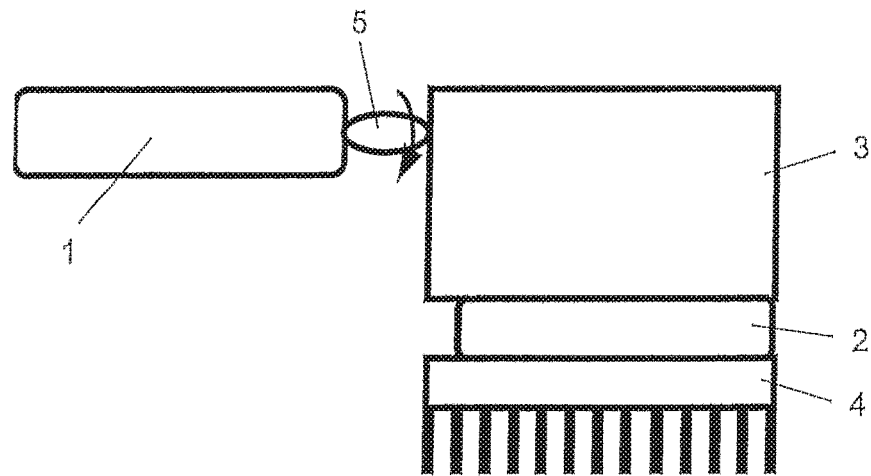
FIG. 2 depicts a first embodiment of the invention.

In the exemplary embodiment according to FIG. 2, the heat transfer element 5 is comprised of an elliptic rod. The heat transport between the thermal storage element 3 and the measuring cell 1 can be activated and deactivated by simply rotating the rod with an elliptic cross section. The transported energy is basically a function of the mean length, the mean cross section of the transport channel (rod) and the temperature difference between the measuring cell 1 and the thermal storage element 3.

Figure 3:
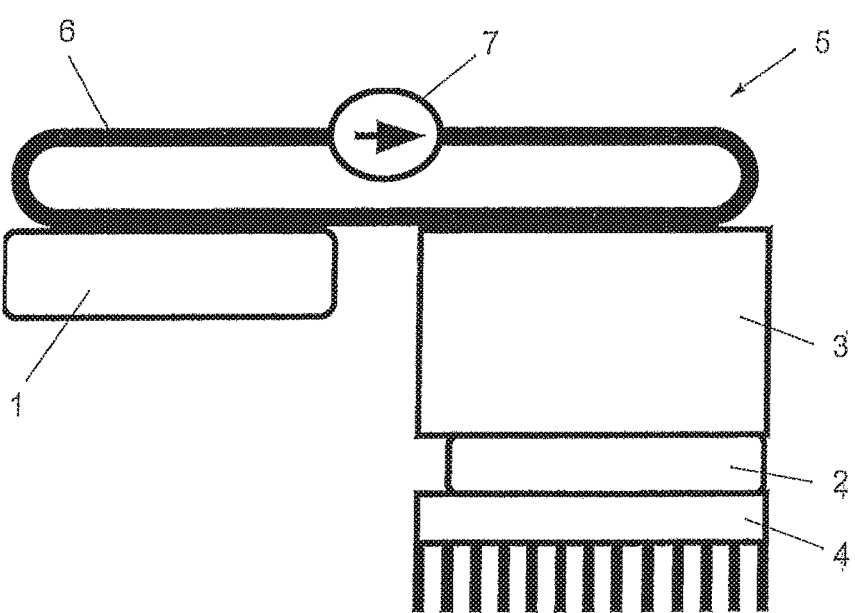
FIG. 3 depicts a second embodiment of the invention.

In the alternative embodiment according to FIG. 3, the heat transport is effected via a liquid. In this case, a liquid is transported from the thermal storage element 3 to the measuring cell 1 and back by a pump 7 in a closed pipe system 6 (forced convection). The thermal energy absorbed by the liquid on the measuring cell 1 is again released on the thermal storage element 3 as long as the temperature of the latter is lower than that of the liquid. The transferable thermal energy, with given material parameters, substantially depends on the volume flow of the liquid.

In a manner similar to liquids, gases (air) can also be used for the transport. However, a significantly higher volume flow would be necessary because of the lower thermal capacity of gases, which would call for large cooling bodies on the individual components.

All of the described embodiments have in common that the thermal storage element 3 has a high thermal capacity such that the ratio of the thermal capacity of the thermal storage element 3 to the thermal capacity of the measuring cell 1 is greater than 1:1, preferably at least 2:1, preferably at least 5:1. With the thermal storage element 3 being appropriately precooled, it will be possible to rapidly cool the measuring cell 1 without the thermal storage element 3 reaching a temperature above the limit temperature of the Peltier element 2.

The invention claimed is:

1. A method for measuring material properties of a test sample and subsequently cooling the test sample using a device for controlling the temperature of a test sample in a measuring unit for measuring material properties of the test sample, comprising a measuring cell for receiving the test sample, at least one temperature controlling element, and a thermal storage element coupled to the at least one temperature controlling element to transfer heat, wherein means are provided for changing the thermal resistance between the thermal storage element and the measuring cell in order to selectively couple or decouple the thermal storage element and the measuring cell in terms of heat transfer, comprising the steps of:

a) measuring the material properties of the test sample at a measuring temperature;
   b) before and/or during step a): cooling the thermal storage element in the state decoupled from the measuring cell in terms of heat transfer, by using the at least one temperature controlling element;
   c) after steps a) and b): reducing the thermal resistance between the thermal storage element and the measuring cell in order to couple the thermal storage element and the measuring cell to transfer heat;
   d) continuously transferring heat from the measuring cell to the thermal storage element in a single step, while the test sample is cooled from the measuring temperature to a temperature suitable for removing the test sample; and
   e) removing the test sample,
   wherein no step of cooling the thermal storage element is carried out during a time period from the beginning of step d) until the end of step e), and
   wherein a ratio of a thermal capacity of the thermal storage element to a thermal capacity of the measuring cell is greater than at least 2:1.

2. The method according to claim 1, wherein the ratio of the thermal capacity of the thermal storage element to the thermal capacity of the measuring cell is greater than at least 5:1.

3. The method according to claim 1, wherein the ratio of the thermal capacity of the thermal storage element to the thermal capacity of the measuring cell is selected such that the temperature of the thermal storage element at the end of step d) does not exceed approximately 200° C.

4. The method according to claim 3, wherein the temperature of the thermal storage element at the end of step d) does not exceed approximately 160° C.

5. The method according to claim 4, wherein the temperature of the thermal storage element at the end of step d) does not exceed approximately 120° C.

6. The method according to claim 3, wherein the means for changing the thermal resistance comprise a drive for moving the thermal storage element, the measuring cell and/or an interposed heat transfer element between a first position, in which the thermal storage element and the measuring cell are in thermoconductive contact, and a second position, in which the thermal storage element and the measuring cell are thermoconductively separated from each other.

7. The method according to claim 3, wherein a fluid cycle connecting the thermal storage element and the measuring cell is provided as heat transfer element, and that the means for changing the thermal resistance comprise a pump disposed in the fluid cycle.

8. The method according to claim 1, wherein the means for changing the thermal resistance comprise a drive for moving the thermal storage element, the measuring cell and/or an interposed heat transfer element between a first position, in which the thermal storage element and the measuring cell are in thermoconductive contact, and a second position, in which the thermal storage element and the measuring cell are thermoconductively separated from each other.

9. The method according to claim 8, wherein a fluid cycle connecting the thermal storage element and the measuring cell is provided as heat transfer element, and that the means for changing the thermal resistance comprise a pump disposed in the fluid cycle.

10. The method according to claim 1, wherein a fluid cycle connecting the thermal storage element and the measuring cell is provided as heat transfer element, and that the means for changing the thermal resistance comprise a pump disposed in the fluid cycle.

11. The method according to claim 1, wherein the at least one temperature controlling element comprises a Peltier element.

\* \* \* \* \*